United States Patent
Richardson et al.

(10) Patent No.: US 6,288,909 B1
(45) Date of Patent: Sep. 11, 2001

(54) CONDUCTIVE VIA FEED THROUGH FOR DOUBLE-SIDED MODULES

(75) Inventors: Eric Franklyn Richardson, Sunnyvale; David Andrew Verdon, San Jose; Brett Armstrong Kelley, Redwood City, all of CA (US)

(73) Assignee: Stellex Microwave Systems, Inc., Palo Alto, CA (US)

( * ) Notice: Subject to any disclaimer, the term of this patent is extended or adjusted under 35 U.S.C. 154(b) by 0 days.

(21) Appl. No.: 09/310,657

(22) Filed: May 12, 1999

(51) Int. Cl.[7] .................................................. H05K 7/14
(52) U.S. Cl. ......................... 361/796; 361/730; 361/748
(58) Field of Search .................................... 361/721, 728, 361/729, 730, 735, 736, 748, 796; 257/686, 669; 156/257; 438/660

(56) References Cited

U.S. PATENT DOCUMENTS 5,728,248 * 3/1998 Weber .................................. 156/257
6,110,823 * 8/2000 Eldridge et al. ..................... 438/660

* cited by examiner

*Primary Examiner*—Jeffrey Gaffin
*Assistant Examiner*—Thanh Y. Tran
(74) *Attorney, Agent, or Firm*—Mikio Ishimaru

(57) ABSTRACT

A double-sided module is provided having electrical substrates on either side of a panel housing which are interconnected by a wire connection from one substrate to a conductor-filled through-channel, or via, in the other substrate. The distances from the bonding point on one substrate to the bond vias have to have predetermined ratios of heights to center-to-center distances to avoid failure under ultra high acceleration. A ratio of under 20 to 1 is required to avoid failure under 5,000 gravities of acceleration for a 0.0008 inch diameter wire and under 8.3 to 1 for a 0.002 inch diameter wire.

20 Claims, 1 Drawing Sheet

CONDUCTIVE VIA FEED THROUGH FOR DOUBLE-SIDED MODULES

TECHNICAL FIELD

The present invention relates generally to double-sided modules for electronic applications, and more particularly to feed through interconnects for such applications.

BACKGROUND ART

In the past, for electronic packaging, it was common to form a housing having internal integral panels with electronic substrates attached to both sides of the panels. In order to route connections between the two substrates, it was necessary to fire-in glass feed throughs. The glass feed throughs required that glass beads having through openings therein would have metal pins inserted in the glass beads. Openings for the route connections would be machined into the panels, the glass beads with the pins would be placed and held in the panel openings, and the entire housing fired in an oven to melt the glass to hold the pins in their proper positions. The housing is then gold plated (including the pins). The substrates would then be secured to both sides of the panel and wires, generally of gold, would be bonded to the substrates and then to the ends of the pins to complete the double-sided module. Another option is a soldered-in feed through.

The above technique had many problems. Sometimes, during the oven firing and cooling process, the glass would develop cracks, chips, holes, or bubbles, which would mean the entire housing would have to be rejected. Even one such flaw would be the basis for rejecting the entire housing. Other times, the glass would climb or melt out of the opening in the panel and solidify on the panel surface. This would prevent the substrate from sitting flat on the panel. By not sitting flat on the panel, the substrate could potentially fail electronically or be destroyed from the mechanical stress of acceleration testing, so housings would be rejected for this reason.

Further, the pin could float from one side to the other during the firing process and move so far off center or be angled such that the substrates could be short-circuited together. Even further, since each feed through had four connection points, two to the substrates and two to the pin, these added additional areas of potential failure.

Also, the pins could be improperly plated, which would be another basis for rejecting the housing. The firing temperature for the glass is above the melting point of the gold. This means the pins must be individually wire-wrapped and electro-chemically gold plated after assembly and firing in an extremely labor intensive process.

In addition, on the design side, the fired-in glass feed through created a limitation on the packing density of the number of feed throughs possible within a given panel space. This is because a certain minimum diameter opening is required to fit in the pin and glass bead combination.

Finally, manufacturing was very costly because special graphite fixtures were required due to the high temperatures of firing and because a great deal of manual assembly was required.

Although rejecting a housing was expensive, no defects could be tolerated because of the critical applications in which the double-sided modules were used. While other alternatives were sought, as the use of metal pins for feed throughs has been an industry standard for over twenty years because no better approach has previously been discovered.

DISCLOSURE OF THE INVENTION

The present invention provides a double-sided module having electrical substrates on either side of a housing panel which are interconnected by a wire connection from one substrate to a conductor-filled through-channel, or via, in the other substrate. The distances from the bonding point on one substrate to the bond vias have to have predetermined ratios of heights to center-to-center distances based on manufacturing techniques and tolerances, and to avoid failure during acceleration testing. A ratio of under 20 to 1 is required to avoid failure under 5,000 gravities of acceleration for a 0.0008 inch diameter wire and under 8.3 to 1 for a 0.002 inch diameter wire. The 5,000 gravities constant acceleration test is an industry standard screen method for electronic modules. The purpose of the test is to identify workmanship defects.

The present invention further provides a feed through which does not require the use of glass, which is subject to cracks, chip-outs, holes, or bubbles.

The present invention further provides a double-sided module which is not subject to glass climb or flow or for potential shorting of the backsides of the substrates.

The present invention further provides for a reduced number of wire bonds to reduce the number of failure modes.

The present invention further provides increased packing density of feed throughs through the housing panel.

The present invention further provides for the elimination of gold-plated pins which may be subject to plating problems.

The present invention further provides an easily automated feed through.

The present invention further provides simple conductive via feed throughs which do not require glass beads, pins, plating of the pins, and double wire bonds.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 (PRIOR ART) is a prior art pin in glass feed through; and

BEST MODE FOR CARRYING OUT THE INVENTION

Figure 1:
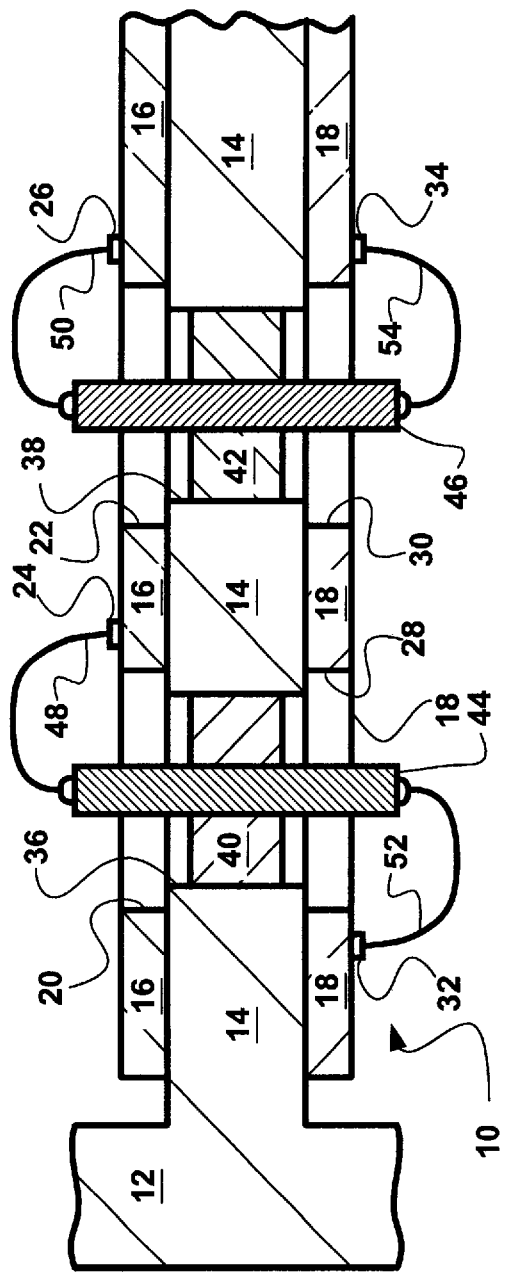

Referring now to FIG. 1 (PRIOR ART), therein is shown an instrument housing 12 made of an iron-nickel alloy. The housing 12 has an internally extending integral housing panel 14 upon which substrates 16 and 18 are bonded using a gold-germanium preform or epoxy (not shown due to its thinness). The substrates 16 and 18 could be of a number of different materials such as plastic or epoxy, but have been generally of alumina in past applications.

The substrate 16 has a plurality of through openings 20 and 22 provided therein with a plurality of adjacent bonding pads 24 and 26, respectively. The substrate 18, similarly, has a plurality of openings 28 and 30 provided therein with a plurality of adjacent bonding pads 32 and 34, respectively.

The housing panel 14 has a plurality of through openings 36 and 38. The through opening 36 is adjacent to the openings 20 and 28 in the substrates 16 and 18, respectively, and the through opening 38 is adjacent to the openings 22 and 30 in the substrates 16 and 18, respectively. Disposed in the openings 36 and 38 are glass beads 40 and 42, respectively, which contain respective through pins 44 and 46. The through pins 44 and 46 are gold-plated metal pins.

The pins 44 and 46 are respectively wire bonded on their top ends by wires 48 and 50, respectively, to the bonding pads 24 and 26, respectively, on the substrate 16. The bottom of the pins 44 and 46 are respectively wire bonded by wires 52 and 54 to the bonding pads 32 and 34, respectively, on the substrate 18. The wire bonding is performed using conventional wire ball-bonding equipment and the wires may be of a number of different materials such as aluminum or copper, but have been generally of gold in past applications.

Figure 2:
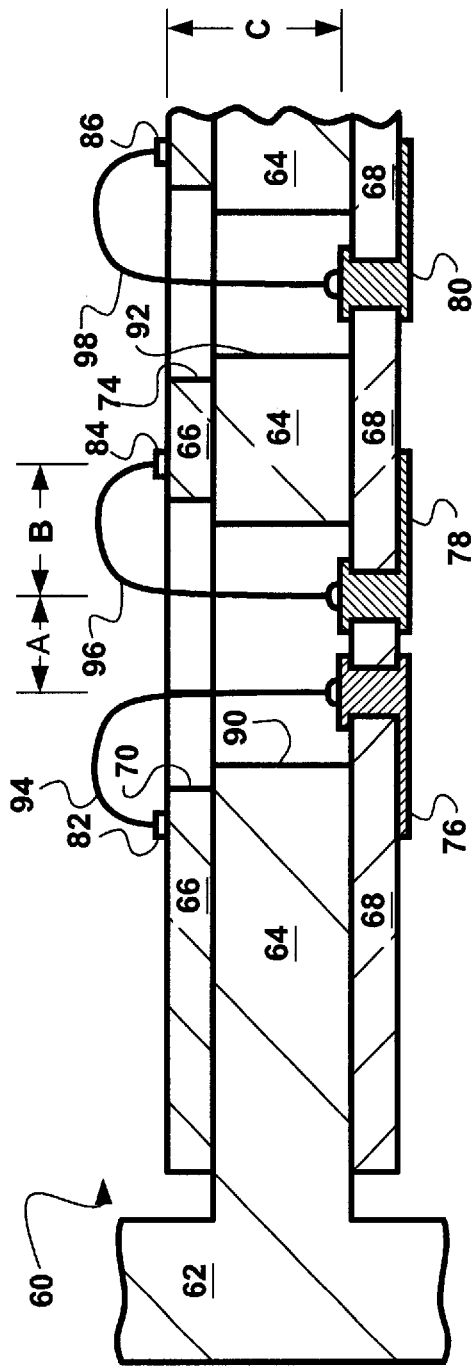
FIG. 2 is the through of the present invention.

Referring now to FIG. 2, therein is shown the double-sided module 60 of the present invention. An instrument housing 62 has an internally extending integral housing panel 64. Bonded to the panel 64 by gold-germanium preforms or epoxy are substrates 66 and 68. The substrate has an opening 70, which is adjacent bonding pads 82 and 84, and an opening 74 provided therein which is adjacent to a bonding pad 86. The opening 70 could be characterized as a slot and the opening 74 as a hole. The bonding pads are connected to electrical components (not shown) on the substrate 66.

The panel 64 has a plurality of openings 90 and 92 which are respectively adjacent to the openings 70 and 74 in the substrate 66 and the bonding pads 82, 84, and 86. The substrates 66 and 68 are electrically connected by wires 94, 96, and 98, respectively, to conductive vias 76, 78, and 80 at one end and at the other to the bonding pads 82, 84, and 86. The wires 94, 96, and 98 are generally gold wires.

In the past, in the manufacture of the dual module 10, the housing 12 would be placed into a graphite fixture (not shown) which would hold the housing and also allow vertical positioning of the glass beads 40 and 42 with their associated pins 44 and 46, respectively. This is a two-step process. The glass beads 40 and 42 are in the form of donut-shaped beads which are positioned first in their respective openings 36 and 38 and then the pins 44 and 46 are dropped into the openings in the centers of the glass beads 40 and 42.

The housing 12 and the graphite fixture are inserted into an oven (not shown) and heated to the melting point of the glass until a hermetic seal forms around the pins 44 and 46, respectively, and in the openings 36 and 38. The housing 12 is then removed from the oven and cooled to room temperature.

After cooling and further processing, the pins 44 and 46 are wire-wrapped and the housing 12 immersed in an electro-chemical plating bath to be plated, generally with gold.

After plating and further processing, the housing 12 is placed in a bonding fixture. A conventional wire-bonding machine is used to bond the wire 48 to form the connection between the pin 44 and the pad 24 and then to bond the wire 50 to form the connection between the pin 46 to the pad 26. The fixture is then flipped and the wire 52 is wire bonded on the other side of the panel 14 to the pin 44 and the pad 32 and the wire 54 is wire bonded to the pin 46 and the pad 34.

In manufacturing the present invention shown in FIG. 2, the substrate 68 is formed with conductive vias 76, 78, and 80. The vias 76, 78, and 80 are configured so as to reach the necessary areas where bonding pads would have been placed in the past. It would further be understood that the via could be plated to be hollow rather than solid in order to reduce the via material, often gold, required for the via The substrates 66 and 68 are then bonded to the panel 64 using the gold-germanium preforms or epoxy. The housing 14 may then be placed in the bonding fixture and the wires 94, 96, and 98 would be wire bonded with one end connected to the conductive vias 76, 78, and 80, respectively, and the other end connected to the bonding pads 82, 84, and 86, respectively. This would complete the manufacture of the double-sided module 60 of the present invention.

It should be noted with the present invention that the distance between the wires 94 and 96 are only limited by a distance A in FIG. 2 which is set by the diameters of the vias 76 and 78 and the necessary clearance between them. The current critical dimension between vias is 0.020-inch which is significantly below the previous minimum dimensions of the glass-bead and pin combination of 0.060-inch dimension A due to the 0.040-inch diameter of the glass beads and the 0.020-inch clearance between them.

However, it has also been determined that the present invention requires that certain horizontal and vertical distances between the bonding pad and the via cannot be exceeded, otherwise a wire will collapse and short to the housing during acceleration testing. The horizontal distance, between the pad 84 on the substrate 66 to the bond on the via 78 in the substrate 68, is the distance designated by B. The vertical distance, between the pad 84 on the substrate 66 to the bond on the via 78 in the substrate 68, is the distance designated by C. These distances B and C are determined by factors which include the acceleration to which the double-sided module 60 will be subjected, the wire diameter, and the wire composition.

For a double-sided module which would be subjected to 5,000 gravities of acceleration and which would have wires of 0.0008 inches in diameter, B must be between 0.0050 and 0.1000 inch and C must be between 0.0000 (i.e., in the same plane) and 0.1000 inch. This means the ratio of vertical to horizontal distance, C:B, must be below about 20:1. For a double-sided module which would be subjected to 5,000 gravities of acceleration and which would have wires of 0.002 inches in diameter, B must be between 0.012 and 0.150 inch and C must be between 0.000 and 0.100 inch. This means the ratio of vertical to horizontal distance, C:B, must be below about 8.3:1.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A double-sided module comprising:
   a housing having an opening provided therein;
   a first substrate secured to said housing and having a bonding pad thereon adjacent to said opening in said housing;
   a second substrate disposed on the opposite side of said housing having a via disposed therein adjacent to said opening in said housing; and
   a connection between said bonding pad and said via through said opening in said housing.

2. The double-sided module as claimed in claim 1 wherein said connection to said bonding pad on said first substrate is away from said housing and said connection to said via on said second substrate is close to said housing.

3. The double-sided module as claimed in claim 1 wherein said connection between said first and second substrates is made from one side of said housing.

4. The double-sided module as claimed in claim 1 wherein said connection between said bonding pad and said via has a vertical dimension, C, which has a ratio to the horizontal distance, B, below 20:1.

5. The double-sided module as claimed in claim 1 wherein said connection between said bonding pad and said via has a vertical dimension, C, which has a ratio to the horizontal distance, B, below 8.3:1.

6. The double-sided module as claimed in claim 1 including a second via disposed therein adjacent to said opening in said housing, said second via adjacent to said first via.

7. The double-sided module as claimed in claim 1 wherein said connection connects said first and second substrates with no more than one wire bond.

8. The double-sided module as claimed in claim 1 wherein said first substrate has an opening provided therein; and said connection is through said opening in said first substrate and said opening in said housing to said via in said second substrate.

9. The double-sided module as claimed in claim 1 wherein said connection between said first and second substrates will withstand in excess of 5,000 gravities of acceleration.

10. The double-sided module as claimed in claim 1 wherein said connection and said vias are made of different materials.

11. A double-sided module comprising:

a housing having an internally extending integral housing panel having a housing opening provided therein;

a first substrate secured to said housing and having a first substrate opening provided therein and a bonding pad thereon adjacent to said first substrate opening;

a second substrate disposed on the opposite side of said integrally extending integral housing and having a via disposed therein adjacent to said opening in said housing; and a wire connection between said bonding pad and said via through said housing opening.

12. The double-sided module as claimed in claim 11 wherein said wire connection to said bonding pad on said first substrate is away from said housing panel and said connection to said via on said second substrate is close to said housing panel.

13. The double-sided module as claimed in claim 11 wherein said wire connection between said first and second substrates is made from one side of said housing panel.

14. The double-sided module as claimed in claim 11 wherein said wire is gold and about 0.0008 inch in diameter; said wire having a distance between said bonding pad and said via with a vertical dimension, C, which has a ratio to the horizontal distance, B, below about 20:1.

15. The double-sided module as claimed in claim 11 wherein said wire is gold and about 0.002 inch in diameter; said wire having a distance between said bonding pad and said via with a vertical dimension, C, which has a ratio to the horizontal distance, B, below about 8.3:1.

16. The double-sided module as claimed in claim 11 including a second via disposed therein adjacent to said opening in said housing, said second via adjacent to said first via and within a horizontal center to center distance, A, of 0.020-inch.

17. The double-sided module as claimed in claim 11 wherein said wire connects said first and second substrates with no more than one wire bond.

18. The double-sided module as claimed in claim 11 wherein said first substrate has a first substrate opening provided therein; and said wire connection is through said first substrate opening and said housing opening to said via in said second substrate.

19. The double-sided module as claimed in claim 11 comprising the double-sided module as claimed in claim 1 wherein said wire between said first and second substrates will withstand in excess of 5,000 gravities of acceleration without collapsing.

20. The double-sided module as claimed in claim 11 wherein said wire and said vias are made of gold.

* * * * *